(12) United States Patent
Mihnea et al.

(10) Patent No.: US 6,587,376 B2
(45) Date of Patent: Jul. 1, 2003

(54) FLASH MEMORY CELL FOR HIGH EFFICIENCY PROGRAMMING

(75) Inventors: Andrei Mihnea, San Jose, CA (US); Paul J. Rudeck, Boise, ID (US); Chun Chen, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/238,317

(22) Filed: Sep. 10, 2002

(65) Prior Publication Data

US 2003/0053338 A1 Mar. 20, 2003

Related U.S. Application Data

(60) Continuation of application No. 09/920,460, filed on Aug. 1, 2001, now Pat. No. 6,449,189, which is a division of application No. 09/466,269, filed on Dec. 17, 1999, now Pat. No. 6,272,047.

(51) Int. Cl.[7] ............................................... G11C 16/04
(52) U.S. Cl. ............................ 365/185.18; 365/185.14
(58) Field of Search ..................... 365/185.18, 185.14, 365/185.24, 185.26, 185.27, 185.28, 185.33

(56) References Cited

U.S. PATENT DOCUMENTS

| | | | | |
|---|---|---|---|---|
| 4,328,565 A | * | 5/1982 | Harari | 365/185.15 |
| 5,029,130 A | | 7/1991 | Yeh | 365/185 |
| 5,235,544 A | | 8/1993 | Caywood | 365/185 |
| 5,258,949 A | | 11/1993 | Chang et al. | 365/185 |
| 5,321,286 A | | 6/1994 | Koyama et al. | 257/315 |
| 5,467,306 A | | 11/1995 | Kaya et al. | 365/185.2 |
| 5,486,480 A | | 1/1996 | Chen | 438/257 |
| 5,487,033 A | | 1/1996 | Keeney et al. | 365/185.19 |
| 5,491,657 A | | 2/1996 | Haddad et al. | 365/185.27 |
| 5,553,020 A | | 9/1996 | Keeney et al. | 365/185.19 |
| 5,574,685 A | | 11/1996 | Hsu | 365/185.18 |
| 5,615,147 A | | 3/1997 | Chang et al. | 365/185.3 |
| 5,739,569 A | | 4/1998 | Chen | 257/321 |
| 5,783,457 A | | 7/1998 | Hsu | 438/302 |
| 5,841,165 A | | 11/1998 | Chang et al. | 257/318 |
| 5,856,946 A | | 1/1999 | Chan et al. | 365/185.19 |
| 5,912,845 A | | 6/1999 | Chen et al. | 365/185.3 |
| 5,940,325 A | * | 8/1999 | Chang et al. | 365/185.28 |
| 5,978,276 A | | 11/1999 | Wong | 365/185.29 |
| 5,986,941 A | | 11/1999 | Pang et al. | 365/185.33 |
| 6,026,017 A | | 2/2000 | Wong et al. | 365/185.05 |
| 6,026,026 A | | 2/2000 | Chan et al. | 365/185.3 |
| 6,040,996 A | | 3/2000 | Kong | 365/185.19 |
| 6,049,479 A | | 4/2000 | Thurgate et al. | 365/185.18 |
| 6,088,263 A | | 7/2000 | Liu et al. | 365/185.05 |
| 6,111,286 A | | 8/2000 | Chi et al. | 257/315 |
| 6,137,727 A | | 10/2000 | Cleveland | 365/185.27 |
| 6,172,397 B1 | | 1/2001 | Oonakado et al. | 257/315 |
| 6,274,901 B1 | | 8/2001 | Odake et al. | 257/315 |
| 6,284,603 B1 | | 9/2001 | Ho Simon et al. | 438/264 |

OTHER PUBLICATIONS

"New Buried Channel FLASH Memory Cell with Symmetrical Source/Drain Structure for 64 Mbit or Beyond", *IEEE Symposium on VLSI Technology*, (1994),69–70.

(List continued on next page.)

Primary Examiner—Michael S. Lebentritt
Assistant Examiner—Anh Phung
(74) Attorney, Agent, or Firm—Schwegman, Lundberg, Woessner & Kluth, P.A.

(57) ABSTRACT

A flash memory cell comprises a gate, a drain, a source, a floating gate, and a control gate. The flash memory cell is capable of being programmed by inducing a voltage drop of between about four volts and six volts across a deep-depletion region by applying a first voltage to the gate, a second voltage to the drain, and a third voltage to the source. During a programming operation, the channel current is approximately zero, and the first voltage is ramped at a rate proportional to the injection current.

33 Claims, 7 Drawing Sheets

OTHER PUBLICATIONS

Bude, J..D. ,et al. ,"EEPROM/Flash Sub 3.0V Drain–Source Bias Hot Carrier Writing", *Internationa Electron Devices Meeting*, (1998),pp. 989–991.

Chen, I..C. ,et al. ,"Band–to–Band Tunneling Induced Substrate Hot–Electron (BBISHE) Injection: A New Programming Mechanism for Nonvolatile Memory Devices", *International Electron Devices Meeting*, (1989),pp. 263–266.

Kencke, D..L. ,et al. ,"The Origin of Secondary Electron Gate Current: A Multiple–stage Monte Carlo Study for Scaled, Low–power Flash Memory", *International Electron Devices Meeting*, (1998),pp. 889–892.

Kim, D..M. ,et al. ,"Stacked Gate Mid–Channel Injection Flash EEPROMCell—Part I: Programming Speed and Efficiency Versus Device Structure", *IEEE Transactions on Electron Devices, 45(8)*, (Aug. 1998),pp. 1696–1702.

Oda, H..,et al. ,"New Buried Channel FLASH Memory Cell with Symmetrical Source/Drain Structure for 64Mbit or Beyond", *Digest. Symposium on VLSI Technology*, (1994), 69–70.

\* cited by examiner

FLASH MEMORY CELL FOR HIGH EFFICIENCY PROGRAMMING

This application is a Continuation of U.S. application Ser. No. 09/920,460, filed Aug. 1, 2001, now U.S. Pat. No. 6,449,189 issued on Sep. 10, 2002, which is a Divisional of U.S. application Ser. No. 09/466,269, filed Dec. 17, 1999 now U.S. Pat. No. 6,272,047.

FIELD OF THE INVENTION

This invention relates to nonvolatile memories, and more specifically to flash electrically erasable programmable memory (EEPROM) devices.

BACKGROUND OF THE INVENTION

The standard programming method, hot channel electron injection, for a flash EEPROM cell requires a cell current on the order of 200–500 micro-amperes. A high cell current is required due to the poor efficiency of the injection mechanism and makes simultaneous programming of a large number of cells in a flash memory array impractical. The unmet need for fast and controllable programming of a flash cell using a low current has long been recognized by many workers in the field.

Yeh, in U.S. Pat. No. 5,029,130, describes a method for high efficiency programming using source-side hot electron injection with a cell current of about 1 micro-ampere. Yeh's method allows simultaneous programming, in a time of between 0.1 milliseconds and 10 milliseconds, of all cells on a row of a memory array to an arbitrary pattern (page write). However, a larger cell size is required to accommodate source-side injection, and the larger cell size increases the complexity of the fabrication process over that which is required in the fabrication of the standard flash EEPROM.

Haddad, in U.S. Pat. No. 5,491,657, describes a programming method using the band-to-band generated current of the drain-to-substrate junction. In general, Haddad's method applies to a cell with a structure similar to the standard flash EEPROM. However, Haddad's cell array is placed inside a triple well (P well surrounded by N well). Haddad also describes programming a cell in between 1 and 100 milliseconds with a cell current of below 1 micro-ampere. This allows simultaneous programming of a plurality of cells in a memory array. However, since Haddad's method requires different gate voltage conditions for the 0 state versus the 1 state, programming of all cells on a row of the memory array to an arbitrary pattern (page write) is not possible. In addition, in a selective data write operation, the band-to-band tunneling process generates both electrons and holes that could be injected with high efficiency into the floating gate, which would disturb the data stored at unselected locations (on selected column and unselected rows) in the memory array. This makes the method inapplicable to the user-mode write function found in a standard device, and useful only in test modes for simultaneous writing of specialized symmetrical patterns of data to an entire memory array or block.

Chen describes a cell structure and biasing method that may allow the band-to-band generated current in a flash memory cell to be selectively turned on and off at specific locations in a memory array, thus making this low current programming mechanism applicable to the standard user-mode write functions. I. C. Chen et al., Band-to-band tunneling induced substrate hot-electron (BISHE) injection: A new programming mechanism for nonvolatile memory devices, 1989 International Electron Devices Meeting Technical Digest—International Electron Devices Meeting, 263–266 (1989). However, the cell structure described by Chen uses a large area, a relatively thick programming dielectric ($SiO_2$) layer, and a large bias voltage, which makes the cell structure unsuitable for use as a replacement for the flash EEPROM devices in use today. Chen's description is limited to the physical programming mechanism, and does not describe the operation of the proposed cell in performing other functions, such as electrical erase, read 1 (erase state) and a particular type of write disturb present in such a memory array, which will be described below. Proper operation in all these functions is required in a flash EEPROM device and will be demonstrated for the cell proposed in this invention.

Chen also describes a design using a programming dielectric of about 100 Å that was rejected due to the potential write disturb by Fowler-Nordheim injection in unselected cells (columns) along the same row with the cell to be programmed. According to the bias scheme proposed by Chen, programming is achieved by applying 4 volts on the drain of the cells to be programmed, 0 volts on the drain of the cells to remain erased, and floating the common source. Chen apparently ignored the fact that, as the drain diffusion is raised to 4 volts and the floating gate coupled to about 10 volts or more in the cells to be programmed, the floating source could also rise to an uncontrolled voltage level. For the symmetrical source/drain structure described by Chen, the source junction could generate as much band-to-band current in any cell as the drain junction. This band-to-band current generated in the source junction together with the current required to charge the source junction capacitance represents an undesirable power drain on the supply (pump) used to provide current for the programming function. Furthermore, if the source potential rises to about 3 volts or more, band-to-band current induced electron injection, which is the same mechanism used to program the selected cells, may cause disturb in the cells intended to remain erased on the selected row.

For these and other reasons there is a need for the present invention.

SUMMARY OF THE INVENTION

The above mentioned problems with flash memory cells and other problems are addressed by the present invention and will be understood by reading and studying the following specification.

A flash memory cell comprises a control gate, a drain region, a source region, and a channel region formed in a common substrate. The flash memory cell is capable of being programmed by inducing a voltage drop of between about four volts and about six volts across a shallow deep-depletion region created near the drain region. The voltage drop is induced by applying a first voltage to the control gate, a second voltage to the drain region, and a third voltage to the source region.

DETAILED DESCRIPTION OF THE PREFERRED EMBODIMENTS

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

Overview

This disclosure will describe a method to modify the industry standard flash cell structure and how it is biased during programming, in order to greatly enhance its programming efficiency.

Cell Structure

Figure 1:
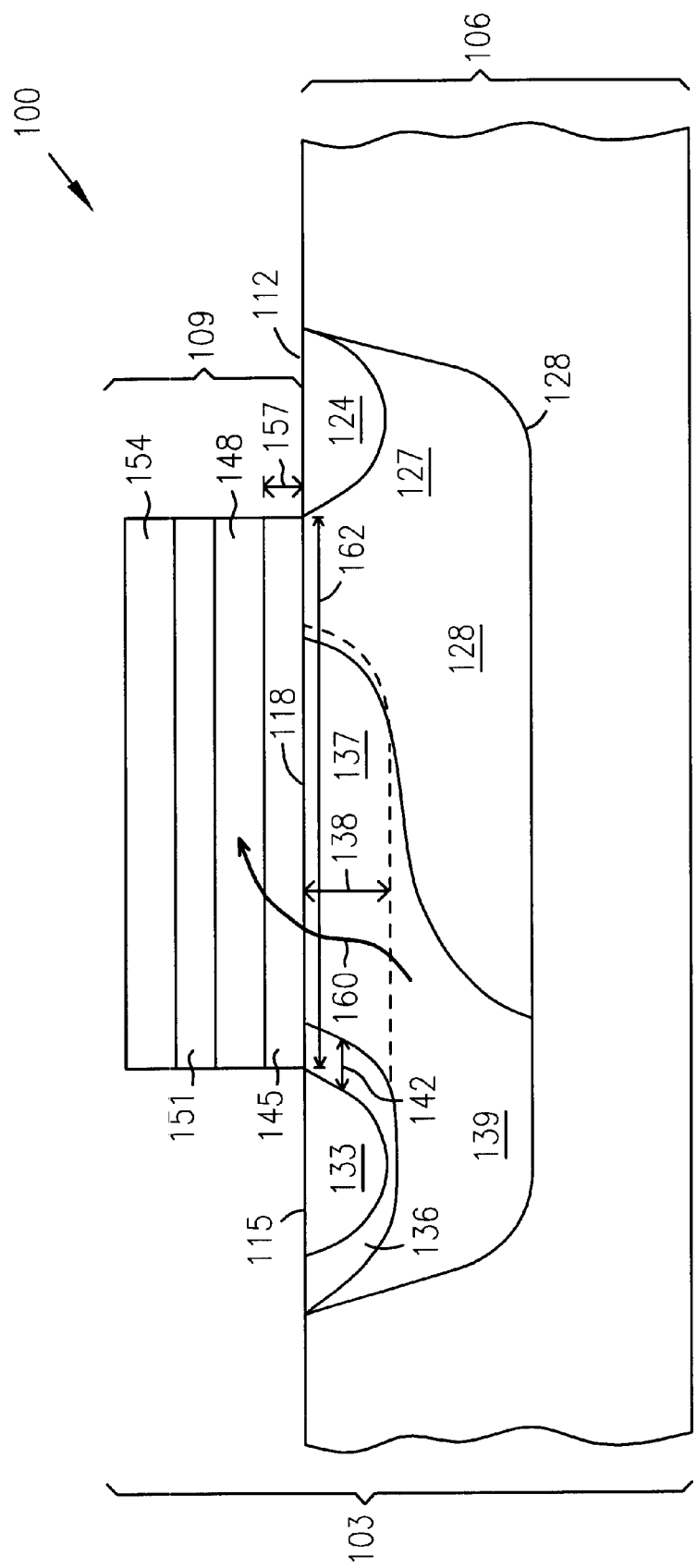
FIG. 1 is a cross-sectional view of some embodiments of a non-volatile memory device of the present invention.

As shown in FIG. 1, the disclosed cell contains a poly gate stack that is typical for flash memory. Below the silicon surface there are both source 112 and drain 115 regions, that are also typical for flash memory. Surrounding both the source and drain regions are highly doped regions that are not typical for flash memory. The doping profiles surrounding the source and drain regions, and contained within parts of the channel region 118, are some of the improvements made to the structure of the industry standard flash cell. Surrounding the source junction, is a heavily doped P-type region 127 that extends from the oxide/silicon interface next to the source junction down to a buried, but similarly doped, P-type region 128. This buried P-type region extends across most of the length of the channel region. The doping profile of the channel region 137 is a highly retrograde P-type. The oxide/silicon surface is: lightly doped and approximately equal to the doping level in lightly doped P-type region 139. Below the oxide interface, the P-type concentration increases sharply (within 0.1 um) to the concentration of the highly doped buried P-type layer. Surrounding the drain region is a graded phosphorous doped region 136 that then abuts up to the lightly doped P-type region 139.

The present invention provides an improved physical structure as shown in FIG. 1 and an improved biasing method to implement selective programming at low current by the band-to-band injection mechanism. The structure is compatible with the standard flash EEPROM cell used in today's memories and is tailored for fast programming at relatively low bias voltages. The size of the structure is also about equal to the size of the standard flash EEPROM cell used in today's memories. The new biasing scheme improves the margin for disturb and allows the use of a thin programming dielectric. All active and passive modes of operation for this cell in a memory array have been tested by electrical simulation and shown to work with adequate margin.

Figure 2A:
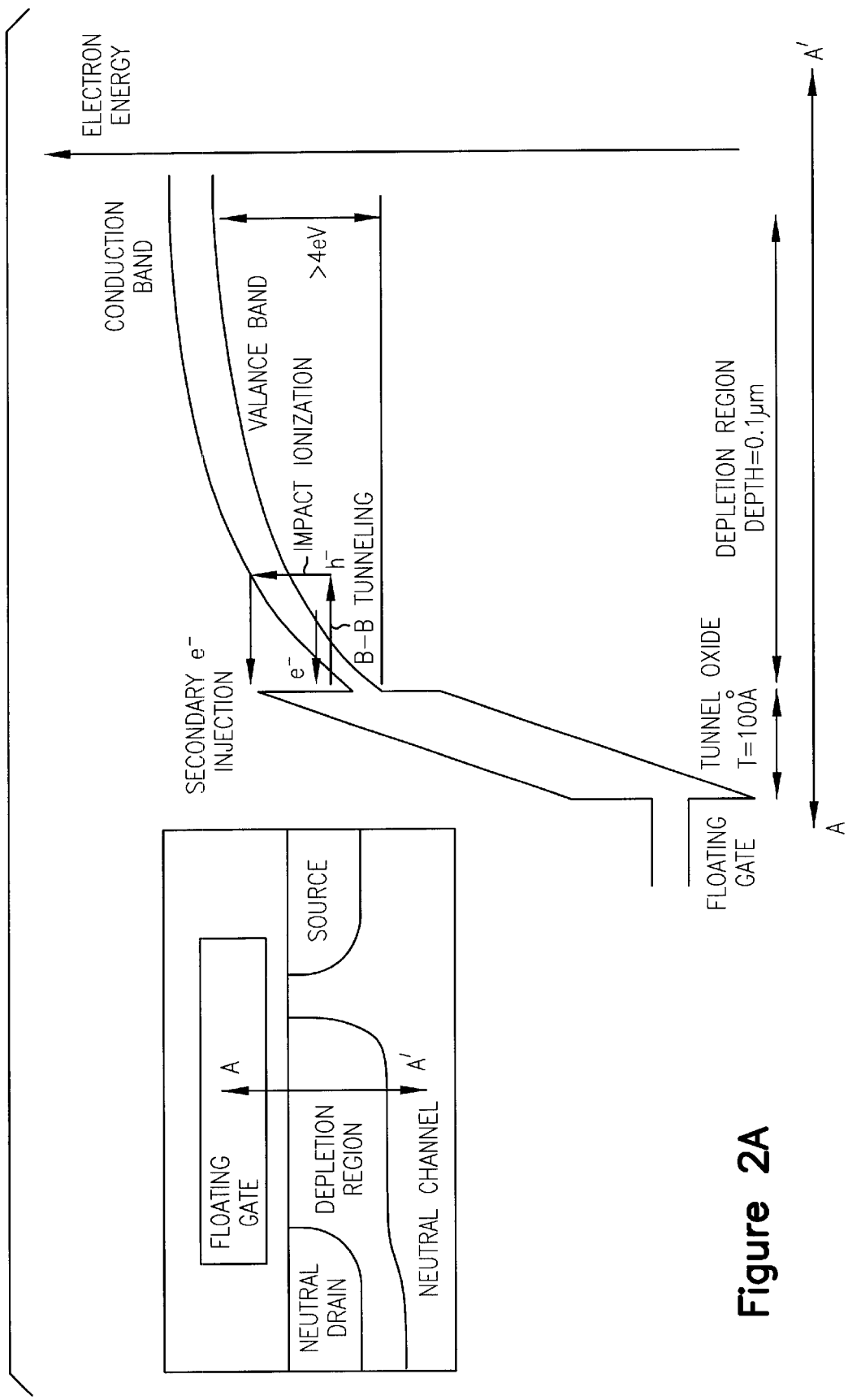
FIG. 2A is a graph of electron energy for band-to-band induced secondary electron injection in a floating gate memory cell as a function of cell depth.
Figure 2B:
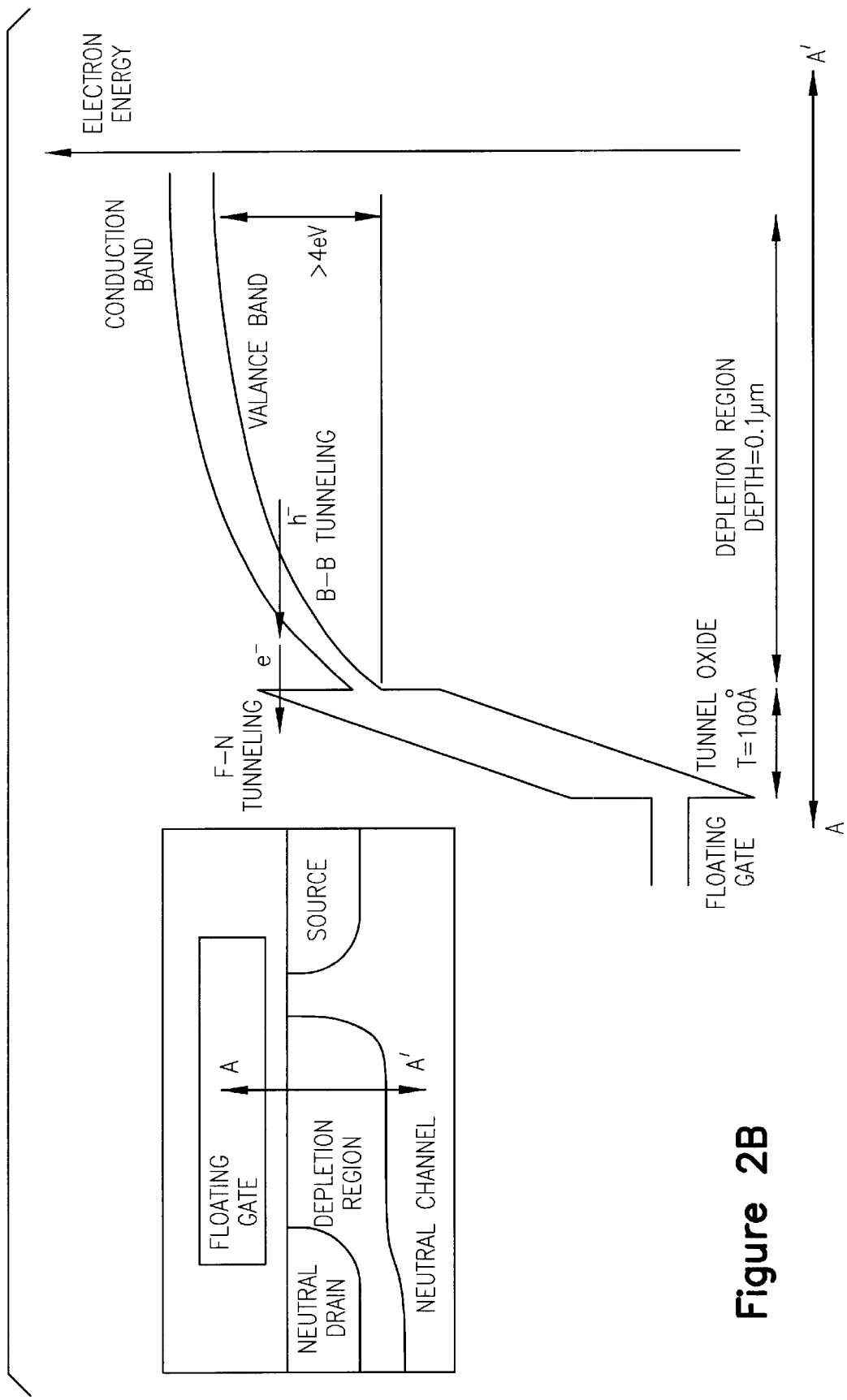
FIG. 2B is a graph of electron energy for band-to-band current induced direct electron injection in a floating gate memory cell as a function of cell depth.

Band-to-band current is generated by the formation of a deep-depletion region near the drain of the selected cell, which extends into a heavily doped P-type region. In order to prevent the flow of band-to-band current in unselected cells (rows) along the selected column in a memory array, the heavily doped P region is added on the source end of the cell's channel, a certain distance away from the drain. This heavily doped P region may be created by high angle boron implantation to form a "pocket" around the source diffusion. In order to increase the efficiency of the electron injection process, the cell structure is designed to have a retrograde net P type dopant concentration profile, below the lightly doped side of the channel. This results in higher vertical electric field at a certain depth in the deep depletion region, which in turn increases the rate of generation of electrons by the substrate current, and by direct band-to-band tunneling. Free electrons created by either of these two mechanisms, can be accelerated in the vertical field of the channel toward the surface and injected into the oxide with high efficiency as shown in FIG. 2A and FIG. 2B.

For similar reasons, a low horizontal electric field in the channel surface near the drain diffusion improves injection efficiency for both injection mechanisms considered, as the electrons flowing toward the channel surface have a lower chance of being drawn into the drain and eliminated from the oxide injection process. To reduce the horizontal electric field near the drain, the heavily doped region of the channel is kept a certain distance away from the edge of the drain diffusion. Furthermore, the cell has a lightly doped extension to the drain diffusion (DDD) similar to the source diffusion in a conventional flash cell, or low doping concentration in the main body of the drain diffusion. These features of the physical structure offer additional advantages. First, there is a reduced drain-to-substrate band-to-band current in unselected cells (rows) along the same column with a cell being programmed. Second, there is a higher breakdown voltage for the drain-to-substrate junction, which allows erasure of a memory block by the already established method of biasing all cell drains to between about 3 volts and 6 volts, and all word lines to −8 to −12 volts.

The programming dielectric comprises silicon dioxide, nitrided silicon dioxide or another dielectric compatible with the standard MOS VLSI technology. The thickness of the programming dielectric layer is similar to that used in the other flash EEPROM devices of today, in the range of between about 80 angstroms and about 120 angstroms. This allows electrical erasure by Fowler-Nordheim tunneling, by the biasing method mentioned above, or by channel erase as will be discussed below. Also, this small oxide thickness allows programming by band-to-band current at a lower gate voltage as described below. One embodiment of a physical cell structure and a two-dimensional doping concentration suitable for supporting the features discussed above is shown in FIG. 1.

FIG. 1 is a cross-sectional view of some embodiments of non-volatile memory device 100. Non-volatile memory device 100 comprises flash memory cell 103 including substrate 106 and stack 109.

Substrate 106 is fabricated from a material, such as a semiconductor, that is suitable for use as a substrate in connection with the fabrication of integrated circuits. Substrate 106 includes doped and undoped semiconductors, epitaxial semiconductor layers supported by a base semiconductor or insulator, as well as other semiconductor structures having an exposed surface with which to form the conductive system of the present invention. Substrate 106 refers to semiconductor structures during processing, and may include other layers that have been fabricated thereon. In one embodiment, substrate 106 is fabricated from silicon. Alternatively, substrate 106 is fabricated from germanium, gallium-arsenide, silicon-on-insulator, silicon-on-sapphire, or any other crystalline or amorphous material suitable for use as a substrate in the manufacture of integrated circuits. Substrate 106 is not limited to a particular material, and the material chosen for the fabrication of substrate 106 is not critical to the practice of the present invention.

Substrate 106 comprises source 112, drain 115, and channel 118 regions. Source 112, in one embodiment, comprises arsenic doped region 124 abutting heavily doped boron region 127. Arsenic doped region 124 is formed by masking source 112 and implanting arsenic ions in substrate 106 to a depth of about 0.1 micron at a density of about $1 \times 10^{20}$ atoms/cm$^3$ or higher.

Drain 115, in one embodiment, comprises arsenic doped region 133 abutting phosphorous doped region 136. Phosphorous doped region 136 abuts lightly doped boron region 139. Arsenic doped region 133 is formed by masking drain 115 and implanting arsenic ions in substrate 106 to a depth of about 0.1 micron at a density of about $1 \times 10^{20}$ atoms/cm$^3$ or higher. Phosphorous doped region 136 is formed by implanting phosphorous ions through the same drain mask into the substrate 106 to a depth of 0.1 micron and a concentration of about $1 \times 10^{19}$ atoms/cm$^3$. Phosphorous doped region 136 extends beyond the edge of the arsenic doped region by a margin 142 of about 0.05 microns.

Channel region 118 includes a channel surface and is located between source 112 and drain 115 and includes heavily doped boron regions 127 and 128 and lightly doped boron region 139. The steep retrograde profile is formed by first implanting boron at a dose of approximately $5 \times 10^{13}$ ions/cm$^2$@20 KeV, followed by implanting arsenic at a dose of approximately $4 \times 10^{12}$ ions/cm$^2$@20 KeV. These implants are performed in place of the normal threshold adjust implant for the cell. The lightly doped boron region 139 is doped to a concentration of about $2 \times 10^{17}$ atoms/cm$^3$. This lightly doped region forms the junction with the phosphorous doped drain region 136 thus avoiding the low-voltage junction breakdown commonly associated with high doping levels in channel 118. Heavily doped net P-type region 127 extends from source 112 to within about 0.14 microns from the edge of the lightly doped drain 136. The region 127 merges in the depth of the channel with region 128, also heavily doped with boron at the same concentration of $1.5 \times 10^{18}$ atoms/cm$^3$. The heavily doped region 128 is located below the lightly doped region 139 and extends toward the phosphorous-doped drain region 136 without joining it. The boundary between the light boron region 139 near the surface and the heavy boron region 128 in the depth of the channel is at about 0.1 micron below the channel surface. Heavy boron region 128 may be formed by high energy boron ion implantation through a mask which exposes the area surrounding the source region 112.

During cell programming, a voltage of about 4 volts is applied on the drain 115, which creates a depletion region 137 spreading in the light boron region 139 of the channel 118. In one embodiment, the extent of spreading of the depletion region 137 is limited by its reaching the boundaries to the heavy boron regions 127 and 128. Thus, the depth 138 of depletion region in the channel is about 0.1 micron, about the same as that of the boundary between the regions 139 and 128. The horizontal extent of spreading of the depletion region is limited by the boundary between regions 139 and 127 in the channel 118, and does not reach the source diffusion 124. Therefore, the potential assumed by the source in programming is not determined by the voltage applied on the drain, and can be set at any convenient value by applying an externally controlled voltage. As will be shown below, using a source voltage in the range 1.5–2.5 volts results in near-zero channel current in programming. The drain voltage of about 4 volts creating a shallow deep-depletion region 137 in the channel, combined with near-zero channel current permits low power and high efficiency programming for the flash memory cell 103.

Stack 109 is located above substrate 106 and comprises gate oxide 145, floating gate 148, dielectric 151, and control gate 154.

Gate oxide 145 is formed above channel 118. In one embodiment, gate oxide 145 is a thermal oxide, such as SiO or SiO$_2$, formed by oxidizing the surface of substrate 106. In one embodiment, gate oxide 145 has a thickness 157 of between about 80 angstroms and about 120 angstroms and a length 162 of about 0.3 microns. If gate oxide 145 has a thickness 157 of less than about 80 angstroms, the probability of charge loss from the floating gate through direct electron tunneling, resulting in potential data retention failure, is increased. If gate oxide 145 thickness 157 is larger than about 120 angstroms, then efficiency of the Fowler-Nordheim tunneling mechanism used in the electrical erase function is decreased.

Floating gate 148 is formed above gate oxide 145. In one embodiment, floating gate 148 is formed from polysilicon deposited to a thickness of between about 500 angstroms and about 5000 angstroms using a chemical vapor deposition (CVD) process. Floating gate 148, in one embodiment, is doped to the desired level using phosphorous and/or arsenic diffusion or implantation. Like in the standard flash memory architecture, the control gates of all cells on the same row in a memory array are merged in a common polysilicon line named wordline. Floating gate 148 accumulates charge from injection current 160 during a programming operation and releases charge during an erase operation.

Dielectric 151, in one embodiment, is formed above floating gate 148 to a depth of about 200 angstroms. In the preferred embodiment, dielectric 151 has a high capacitance value, a low leakage value, and is formed using conventional integrated circuit processing methods. Dielectric 151 is formed from a single layer of dielectric material or a plurality of layers of dielectric material.

Control gate 154 is formed above dielectric 151. Control gate 154, in one embodiment, is formed from polysilicon and may include other conductive materials, such as aluminum, and is deposited to a depth of between about 1500 angstroms and 2000 angstroms. Control gate 154 may be doped to the desired level through phosphorous diffusion.

Operating Conditions for the Recommended Cell Structure Active Biasing

Effective oxide injection from band-to-band current occurs for a voltage of about 4 volts at the drain diffusion and 9–11 volts across a 150–160 angstrom thick programming dielectric. Accordingly, in one embodiment of the present invention, the drain diffusion is operated at about 3–5 volts with about 6–7 volts across the programming dielectric by scaling down the dielectric thickness. Considering the other improvements in injection efficiency for the cell structure of the present invention, as described above, it is anticipated that a successful write operation will occur in the range of 4–6 volts across the programming dielectric. For a value of about 0.7 for the coefficient of capacitive coupling between the floating gate and the control gate, this translates to about 7–11 volts for the voltage on the control gate in programming, which is in agreement with the operating conditions for the conventional flash cell.

In one embodiment of the present invention, the common source is actively biased during programming to a voltage of between about 1.5 volts and 2.5 volts, which is derived from the main chip power supply. Thus, the capacitance and band-to-band current of the source junction do not load the pumped current supply for the program function. Also, by keeping the source voltage at a controlled level below about 3 volts, disturb from the band-to-band current of the source is minimized. Since each cell only requires a low current, programming to an arbitrary data pattern occurs simultaneously in all cells along a selected row of the memory array (page mode write function). The same voltage as is on the source, a voltage of between about 1.5 and 2.5 volts, is actively applied on the drains (bitlines) for the cells that are to remain erased. This embodiment has several advantages in that it prevents further flow of current from the common source to the drains of the cells that are to remain erased, and also prevents write disturb by the Fowler-Nordheim tunneling mechanism to the cells that are to remain erased.

In order to maintain a low current value in programming using an actively biased source, the potential on the floating gates of the cells selected for programming must not exceed the threshold for conduction for the given channel doping profile. To ensure that the floating gate potential is kept at a controlled value during programming, in one embodiment, a ramped wordline voltage is used in the page write function. In this way, the ramp rate controls the floating gate potential according to the equation:

$$IF(VF, VD, VS) = C_G * dV_G/dt.$$

$I_F$ is the gate current arising from the band-to-band injection mechanism, expressed as a function of floating gate potential $V_F$ and voltages applied on the drain ($V_D$) and source ($V_S$) in programming (assuming the substrate is grounded). $C_G$ is the floating gate-to-control gate capacitance of the cell. $V_G$ is the instantaneous control gate (wordline) voltage, and $dV_G/dt$ is the ramp rate for the wordline voltage.

In turn, the floating gate potential during programming, along with the drain and source voltages defined above, controls the cell current:

$$ID = ID(VF, VD, VS).$$

Figure 3A:
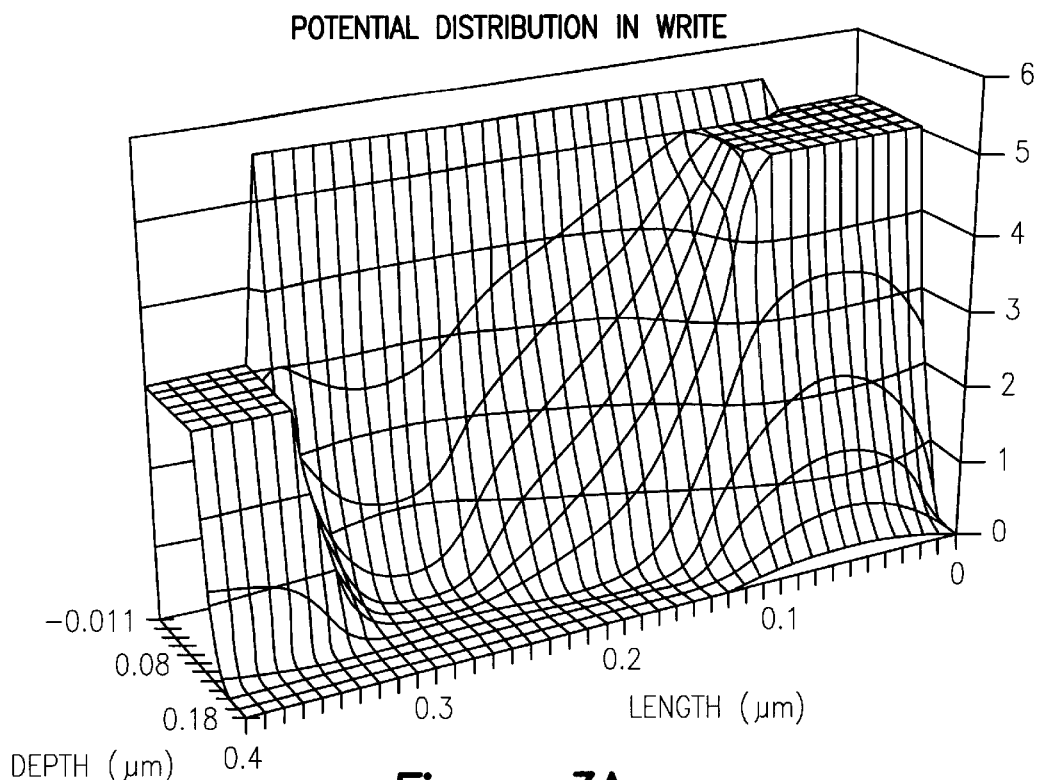
FIG. 3A is a graph of a two-dimension potential distribution for a write function.
Figure 3B:
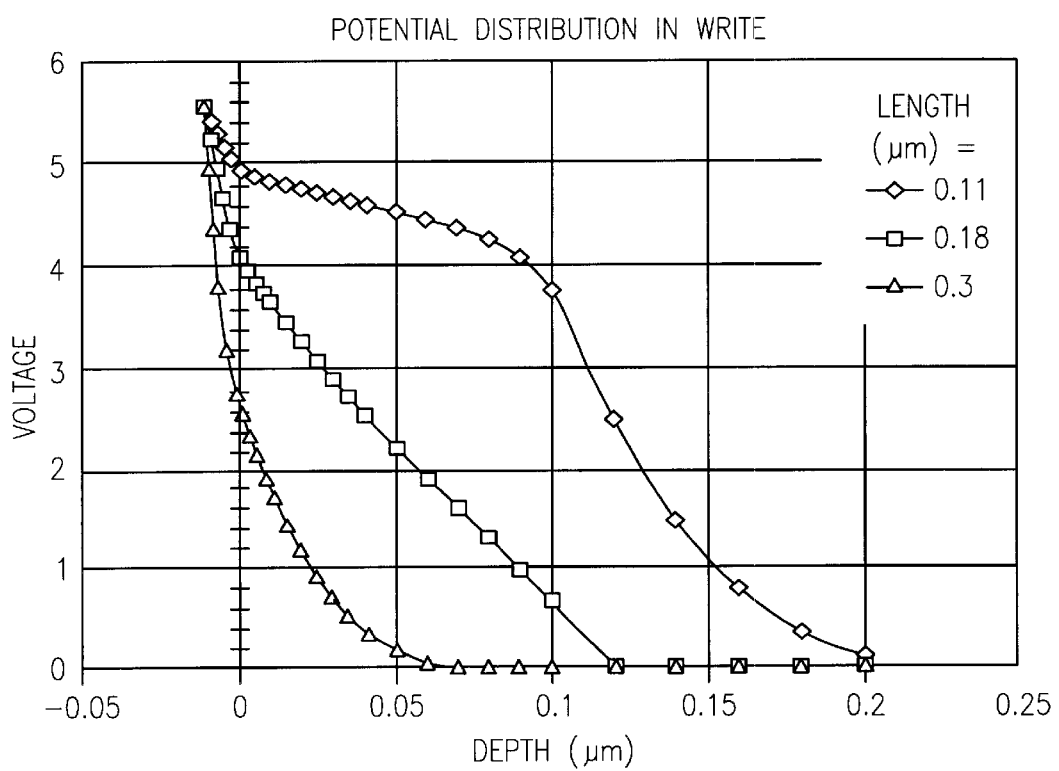
FIG. 3B is a graph of vertical potential distribution at selected points along a channel.

The duration of the programming function depends on the ramp rate of the wordline voltage. According to the equation shown above, the ramp rate has to match the effective gate injection current, IF, at the given drain voltage for the particular cell structure, and at the same time keep the drain current at a low value during programming. For a flash memory cell having a programming drain current of 1 micro-ampere/cell, a gate coupling capacitance of $C_G = 1$ femto-Farad, and a gate injection efficiency as high as $10^{-4}$ for the band-to-band electron injection process, the ramp rate for the wordline voltage is about 0.1 volt/microsecond. The simulated potential distribution for the write condition illustrated in FIG. 3A and FIG. 3B shows that the structure and applied conditions selected to provide the necessary total potential drop of over 4 volts and a high vertical electric field in the deep depletion region near the drain of the cell to sustain a high efficiency injection. This results in a program time equal to 30 μs (micro-seconds) for the page write function as defined in Table 1. For a practical implementation having conditions similar to those described in Table 1, page write times are in the range of 10 microseconds to 1 millisecond.

An example for the bias conditions for the basic memory functions is provided in Table 1.

TABLE 1

| Function | $V_S$ | $V_D$ | $V_F$ | $V_G$ | (A/μm $I_{DS}$) | |
|---|---|---|---|---|---|---|
| Read 1 | 0 | 1 | 3 | 5 | 4.17E−04 | |
| Write | 2 | 4 | 4.5 | 7.5 | 8.87E−13 | FIG. 3 |
| Write | 2 | 4 | 4.5 | 10.5 | 8.87E−13 | FIG. 3 |
| Margin 0 | 0 | 1 | 2 | 6.333333 | 2.43E−06 | |
| Wrt | 2 | 4 | <2.5 | 0 | <1E−30 | |
| Erase | float | 4 to 6 | −10 to −6 | −8 to −12 | N/A | |
| Recovery | 2 | 4 | 4.5 | 0 to 7.5 | 8.87E−13 | FIG. 3 |

The $I_{DS}$ values for cell or channel current in relevant memory functions, and the two-dimensional potential distribution in write (FIG. 3) have been calculated by computer simulation for the physical cell structure in FIG. 1. The floating gate was assumed to be neutral for the read 1 (erased) and write start conditions above.

Since the embodiments of this cell form the basis for a new approach to flash EEPROM memory, the embodiments also support the electrical erase function. The electrical erase function is accomplished as in standard flash EEEPROM devices for a group of cells in the memory array (erase block). As described above, a positive voltage of between about 4 volts and about 6 volts and negative voltage of about −10 volts are simultaneously applied to the drains (bitlines) of all the memory cells in the erase block and, respectively, all the word lines in the erase block. Such an erase function takes between about 10 milliseconds and a few seconds to complete, which is within the range of erase times described in the specifications of standard memory devices. Alternatively, a channel erase mode is implemented by applying a higher negative voltage of between about −16 volts and about −20 volts on all word lines in the block, or any combination of a negative voltage on the word lines and a positive voltage on the P well surrounding all the cells in the block.

The embodiments of this flash cell, like the flash cell used in the current standard flash memory, make the memory operation susceptible to overerasure. Such overerasure, as in the current standard flash memories, may induce a read 0 failure due to the column leakage created by overerased cells. Also, an over erased cell may conduct a much higher current in the programming function than the value shown in Table 1, thus overloading the current supply for a page write operation. To avoid overerasure, the standard erase pulse and verify algorithm are used for the block erase function. Also, a specific recovery method for a small number of over erased cells per block is available. This recovery method is essentially identical to a ramped write function with a lower range, about 0 volts to about 7 volts, for the wordline voltage and a slower ramp rate, on the order of about 1 to about 10 milliseconds for the entire ramp. The voltage range of the ramped write function avoids programming the cells to a higher threshold. This function can be simultaneously applied to all cells in an erase block, given the typically low number of overerased cells and the reduced current per cell due to the lower ramp rate.

The present invention provides a flash memory cell for use in non-volatile storage devices. In an exemplary embodiment, the flash memory cell comprises a gate, a drain, and a source, all in a common substrate. The flash memory is capable of being programmed at near-zero channel current by inducing a voltage drop of between about four volts and about six volts across a shallow deep-depletion region in the channel by applying a first voltage to the gate, and a second voltage to the drain and a third voltage to the source.

Figure 4:
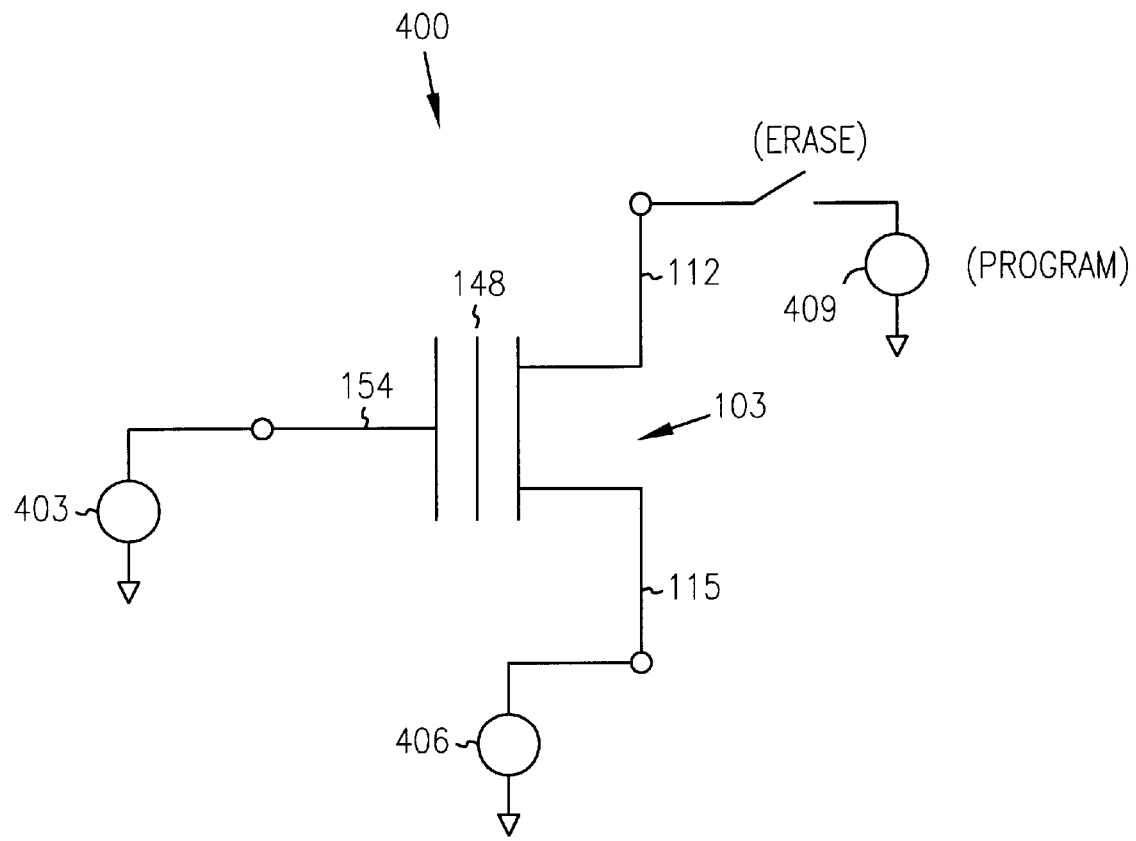
FIG. 4 is a schematic diagram of the non-volatile memory device of FIG. 1 illustrating the program and erase modes of operation.

FIG. 4 is a schematic diagram 400 of non-volatile memory device 100 of FIG. 1, illustrating the program and erase modes of operation of flash memory cell 103. As in FIG. 1, flash memory cell 103 includes source 112, drain 115, and control gate 154. Flash memory cell 103 is programmed by coupling first voltage 403 to the control gate 154, coupling second voltage 406 to the drain 115 and third voltage 409 to the source 112. In the programming mode of operation, first voltage 403 is greater than second voltage 406, which is greater than third voltage 409. In the preferred programming mode of operation, first voltage 403 is ramped between 7 and 11 volts, second voltage is about 4 volts and third voltage 409 is about 2 volts.

An advantage of this cell structure and bias scheme in programming operation for the flash memory cell 103 is that programming is achieved using relatively low voltage and power. Programming memory cells using low power permits the design of a high performance computer system incorporating a large amount of flash memory without significantly increasing the size of the system power supply to support the programming of the flash memory.

Programming flash memory cell 103 causes charge to accumulate on floating gate 148. The accumulation of charge causes an increase in the turn-on voltage threshold of flash memory cell 103. This increase in the turn-on voltage threshold of flash memory cell 103 prevents a read signal applied to control gate 154 from turning on flash memory cell 103, and thus a logical zero is detected by the read sense amplifier.

Flash memory cell 103 is erased by floating source 112, coupling first voltage 403 to control gate 154 and coupling second voltage 406 to drain 115. In the preferred erase mode of operation, first voltage 403 is in the range −8 volts to −12 volts (to be applied to the control gate 154) and second voltage 406 is in the range 4 volts to 6 volts (to be applied to the drain 115). Erasing flash memory cell 103 causes the removal of the charge that accumulated on floating gate 148 of flash memory cell 103 during a programming operation. Erasing flash memory cell 103 also causes a decrease in the turn-on voltage threshold of memory cell 103 and a logical one to be stored by memory cell 103. By decreasing the turn-on voltage threshold of memory cell 103, a read signal applied to control gate 154 causes memory cell 103 to switch on during a read operation, which results in a logical one being detected by the sense amplifier during a read operation.

Figure 5:
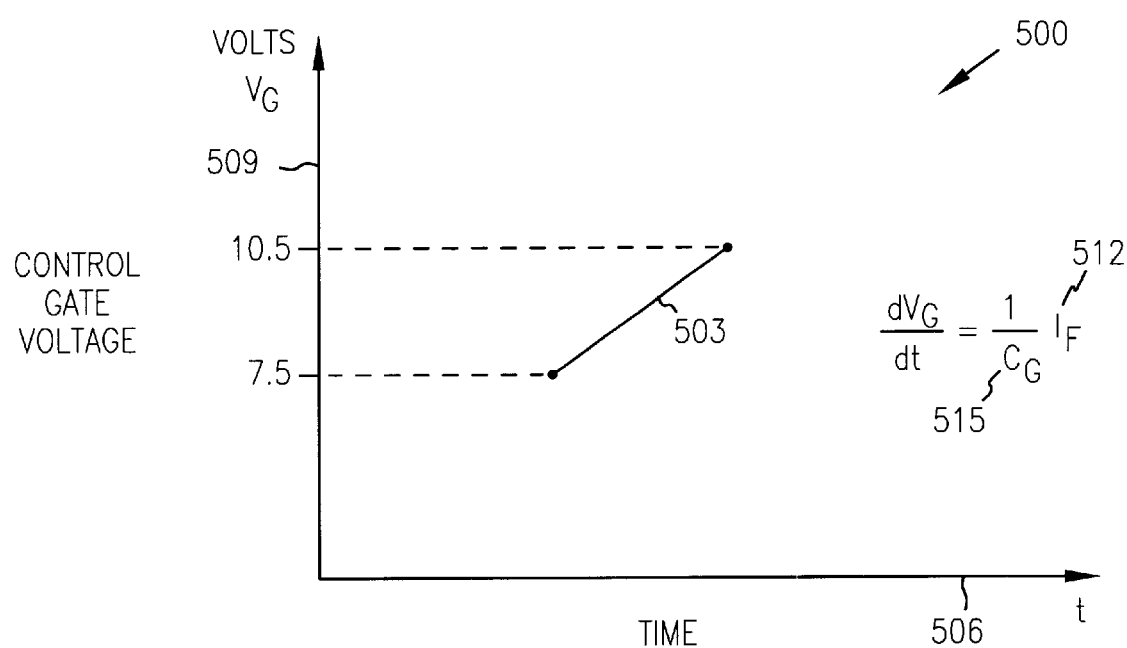
FIG. 5 is graph of a ramped control gate voltage signal versus time.

FIG. 5 is a graph 500 of ramped control gate voltage signal 503. Graph 500 includes x-axis 506, y-axis 509, and ramped control gate voltage signal 503. The x-axis 506 shows time increasing. The y-axis 409 shows gate voltage ($V_G$) increasing. Gate voltage ($V_G$) has the units of volts. As described above, in the preferred embodiment of the programming mode of operation, control gate voltage signal 503 is ramped from about 7.5 volts to about 10.5 volts. The equation shown below defines the relationship between the rate of change of the ramped gate voltage signal ($V_G$) 503, injection current ($I_F$) 512, and control gate to floating gate capacitance ($C_G$) 515.

$$\frac{dV_G}{dt} = \frac{1}{C_G} I_F$$

The rate of change of the ramped gate voltage signal 503 is proportional to injection current 160 shown in FIG. 1. The preferred proportionality constant is the reciprocal of the control gate to floating gate capacitance 515. Ramping control gate voltage signal 503 at a slower rate increases the time to charge floating gate 148 of FIG. 1. Ramping first voltage 403 at control gate 154 at a faster rate exceeds the charging rate of floating gate 148 and is less efficient in charging floating gate 148.

Figure 6:
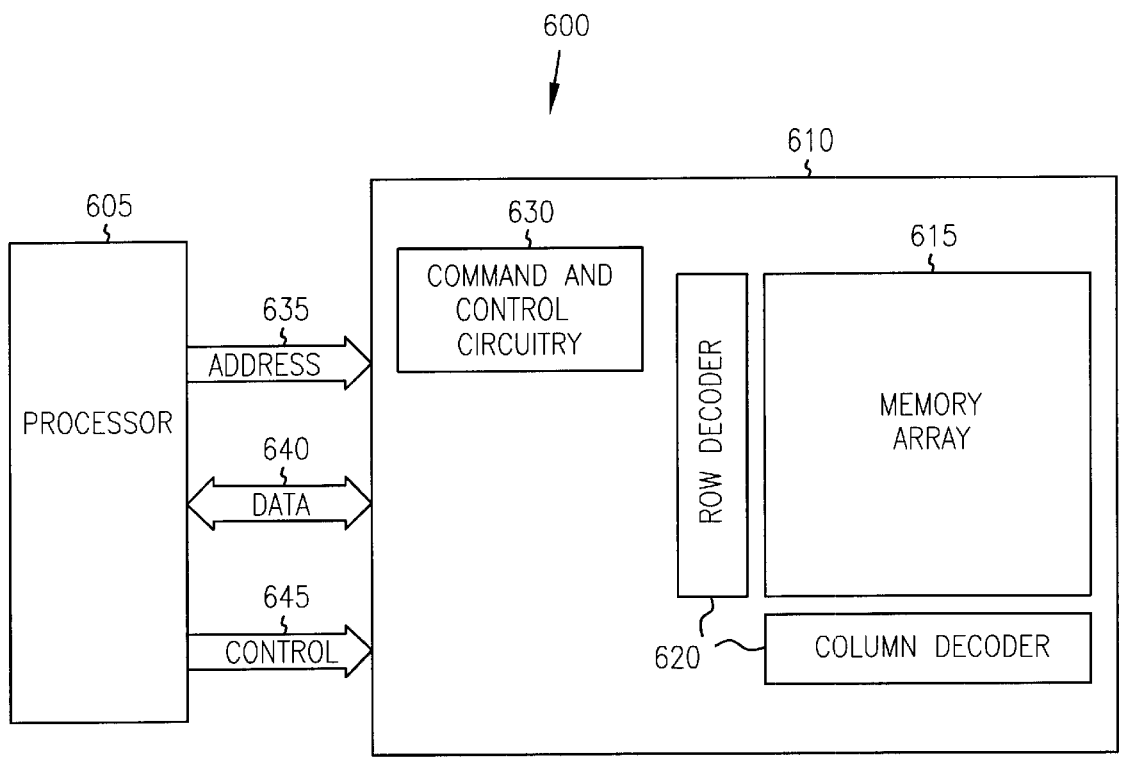
FIG. 6 is a block diagram of a computer system suitable for use in connection with the present invention.

FIG. 6 is a block diagram of a computer system suitable for use in connection with the present invention. Referring to FIG. 6, a block diagram of a system level embodiment of the present invention is shown. System 600 comprises processor 605 and memory device 610, which includes non-volatile memory device structures of one or more of the types described above in conjunction with FIGS. 1–5. Memory device 610 comprises memory array 615, address circuitry 620, and read circuitry 630, and is coupled to processor 605 by address bus 635, data bus 640, and control bus 645. Processor 605, through address bus 635, data bus 640, and control bus 645 communicates with memory device 610. In a read operation initiated by processor 605, address information, data information, and control information are provided to memory device 610 through busses 635, 640, and 645. This information is decoded by addressing circuitry 620, including a row decoder and a column decoder, and read circuitry 630. Successful completion of the read operation results in information from memory array 615 being communicated to processor 605 over data bus 640.

CONCLUSION

Several embodiments of a non-volatile memory device for storing information have been described. These embodiments permit programming of non-volatile memory devices at high speed and low power. Although specific embodiments have been illustrated and described herein, it will be appreciated by those of skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A flash memory cell comprising:
  a source having an arsenic doped region, the source being surrounded by a heavily doped p-type region;
  a drain;
  a channel coupling the source and drain; and
  a control gate located above the channel, wherein the flash memory cell is programmed by applying a voltage between about 1 volt and about 2.5 volts to the source and generating a voltage of more than about four volts across a depletion region in the channel.

2. The flash memory cell of claim 1, wherein the flash memory cell programmed by generating a voltage of more than about four volts across the depletion region in the channel region includes the flash memory programmed by applying a first voltage to the control gate and applying a second voltage less than the first voltage to the drain region.

3. The flash memory cell of claim 1, wherein the depletion region extends from the drain in the channel to a point short of reaching the source.

4. The flash memory cell of claim 1, wherein the source, the drain, the channel, and the control gate are formed in a common substrate, the substrate selected from a group consisting of germanium, gallium-arsenide, silicon-on-insulator, and silicon-on-sapphire.

5. The flash memory cell of claim 1, wherein the depletion region has a depth that extends about 0.1 microns into the channel from a surface of the channel.

6. A flash memory comprising:
   a source having an arsenic doped region, the source being surrounded by a heavily doped boron region;
   a drain;
   a channel coupling the source and drain; and
   a control gate located above the channel, wherein the flash memory is programmed by applying a voltage between about 1 volt and about 2.5 volts to the source and generating a voltage of more than about four volts across a depletion region in the channel.

7. The flash memory of claim 6, the flash memory programmed by generating a voltage of more than about four volts across the depletion region in the channel region includes the flash memory programmed by applying a first voltage to the control gate and applying a second voltage less than the first voltage to the drain region.

8. The flash memory of claim 6, wherein the boron region has a boron concentration of about $1.5 \times 10^{18}$ atoms/cm$^3$.

9. The flash memory of claim 6, wherein the control gate is formed from polysilicon doped with phosphorous.

10. A flash memory comprising:
    a source surrounded by a heavily doped boron region;
    a drain having an arsenic region surrounded by a phosphorous doped region, the drain abutting a lightly doped boron region;
    a channel extending between the source and drain; and
    a control gate located above the channel, wherein the flash memory is programmed by applying a voltage between about 1 volt and about 2.5 volts to the source and generating a voltage of more than about four volts across a depletion region in the channel region.

11. The flash memory of claim 10, wherein the arsenic region is formed by implanting arsenic to a depth of about 0.1 micron at a density greater than about $1 \times 10^{20}$ atoms/cm$^3$.

12. The flash memory of claim 10, wherein the phosphorous doped region extends about 0.05 microns from an edge of the arsenic region.

13. The flash memory of claim 10, wherein the control gate is separated from the channel by a gate oxide having a thickness ranging from about 80 angstroms to about 120 angstroms.

14. A flash memory comprising:
    a source having a heavily doped arsenic region, the source surrounded by a heavily doped boron region;
    a drain having a heavily doped arsenic region surrounded by a phosphorous doped region, the drain abutting a lightly doped boron region;
    a channel having a surface, the surface extending from the source to the drain, the channel having a lightly doped boron channel region extending from the surface; and
    a control gate formed in a common substrate with the source, the drain, and the channel, wherein the flash memory is programmed by applying a voltage between about 1 volt and about 2.5 volts to the source, and generating a voltage of more than about four volts across a depletion region in the channel.

15. The flash memory of claim 14, wherein the phosphorous doped region has a phosphorous concentration of about $10^{19}$ atoms/cm$^3$.

16. The flash memory of claim 14, wherein the lightly doped boron region abutting the drain forms a junction with the phosphorous doped region.

17. The flash memory of claim 14, wherein the heavily doped arsenic region of the drain is formed by implanting arsenic to a depth of about 0.1 micron at a density of about $1 \times 10^{20}$ atoms/cm$^3$.

18. A flash memory comprising:
    a source having an arsenic doped region, the source being surrounded by a heavily doped p-type region;
    a drain;
    a channel having a surface, the surface extending from the source to the drain, the channel having a heavily boron doped buried channel separated from the surface by a lightly doped boron region; and
    a control gate located above the channel, wherein the flash memory is programmed by applying a voltage between about 1 volt and about 2.5 volts to the source and generating a voltage of more than about four volts across a depletion region in the channel.

19. The flash memory of claim 18, wherein the heavily doped boron buried channel and the lightly doped boron region of the channel form a boundary at about 0.1 micron from the surface.

20. The flash memory of claim 18, wherein the lightly doped boron region has a doping concentration of about $2 \times 10^{17}$ atoms/cm$^3$.

21. The flash memory of claim 18, wherein the arsenic doped region is formed by implanting arsenic to a depth of about 0.1 micron at a density of about $1 \times 10^{20}$ atoms/cm$^3$.

22. A flash memory comprising:
    a source;
    a drain having a heavily doped arsenic region surrounded by a phosphorous doped region, the drain abutting a lightly doped boron region;
    a channel having a surface, the surface extending from the source to the drain, the channel having a heavily boron doped buried channel separated from the surface by a lightly doped boron region; and
    a stack, the stack formed in a common substrate with the source, the drain, and the channel, the stack having a control gate, a gate dielectric, a floating gate, and an oxide layer, the stack located above the channel, wherein the flash memory is programmed by applying a voltage between about 1 volt and about 2.5 volts to the source, and generating a voltage of more than about four volts across a depletion region in the channel.

23. The flash memory of claim 22, wherein the heavily boron doped buried channel extends from the source region to a distance of about 0.14 microns from the drain region.

24. The flash memory of claim 22, wherein the oxide layer comprises a thermal oxide, the oxide layer formed on the surface of the channel region, the oxide layer having a thickness of between about 80 angstroms and about 120 angstroms.

25. The flash memory of claim 22, wherein the gate dielectric is formed on the floating gate, the gate dielectric having a thickness of about 200 angstroms.

26. A system comprising:

a processor; and a memory coupled to the processor, the memory having a plurality of flash memory cells, each of the plurality of flash memory cells having:

a source having an arsenic doped region, the source being surrounded by a heavily doped boron region;

a drain;

a channel having a surface, the surface extending from the source to the drain, the channel having a lightly doped boron channel region extending from the surface; and a control gate located above the channel, wherein the flash memory cell is programmed by applying a voltage between about 1 volt and about 2.5 volts to the source of each of the plurality of flash memory cells, and generating a voltage of more than about four volts across a depletion region in the channel of each of the plurality of flash memory cells programs each of the plurality of flash memory cells.

27. The system of claim 26, the flash memory cell programmed by generating a voltage of more than about four volts across the depletion region in the channel region includes the flash memory cell programmed by applying a first voltage to the control gate and applying a second voltage less than the first voltage to the drain region.

28. The system of claim 26, wherein the boron region surrounding the source has a boron concentration of about $1.5 \times 10^{18}$ atoms/cm$^3$.

29. The system of claim 26, wherein the control gate is formed from polysilicon doped with phosphorous.

30. A system comprising:

a processor; and a memory coupled to the processor, the memory having a plurality of flash memory cells, each of the plurality of flash memory cells having:

a source having an arsenic doped region, the source being surrounded by a heavily doped boron region;

a drain;

a channel having a surface extending between the source and drain, the channel having a heavily boron doped buried channel separated from the surface by a lightly doped boron region; and a control gate located above the channel, wherein the flash memory cell is programmed by applying a voltage between about 1 volt and about 2.5 volts to the source of each of the plurality of flash memory cells, and generating a voltage of more than about four volts across a depletion region in the channel of each of the plurality of flash memory cells programs each of the plurality of flash memory cells.

31. The system of claim 30, the flash memory cell programmed by generating a voltage of more than about four volts across the depletion region in the channel region includes the flash memory cell programmed by applying a first voltage to the control gate and applying a second voltage less than the first voltage to the drain region.

32. The system of claim 30, wherein the heavily doped boron buried channel and the lightly doped boron region of the channel form a boundary at about 0.1 micron from the surface.

33. The system of claim 30, wherein the heavily boron doped buried channel extends from the source region to a distance of about 0.14 microns from the drain region.

* * * * *

UNITED STATES PATENT AND TRADEMARK OFFICE
CERTIFICATE OF CORRECTION

PATENT NO. : 6,587,376 B2
DATED : July 1, 2003
INVENTOR(S) : Andrei Mihnea, Paul J. Rudeck and Chun Chen It is certified that error appears in the above-identified patent and that said Letters Patent is hereby corrected as shown below:

Column 3,
Line 53, delete ":" after "is".
Line 56, delete "um" and insert -- $\mu$m -- therefor.

Column 7,
Line 41, delete "IF(VF, VD, VS)" and insert -- $I_F(V_F, V_D, V_S)$ -- therefor.
Line 53, delete "ID=ID(VF,VD,VS)." and insert -- $I_D=I_D(V_F,V_D,V_S)$. -- therefor.
Line 58, delete "IF" and insert -- $I_F$ -- therefor.

Signed and Sealed this

Seventeenth Day of February, 2004

JON W. DUDAS
*Acting Director of the United States Patent and Trademark Office*